(12) United States Patent
Nguyen

(10) Patent No.: US 11,530,751 B2
(45) Date of Patent: Dec. 20, 2022

(54) CLOSURE MECHANISM VACUUM CHAMBER ISOLATION DEVICE AND SUB-SYSTEM

(71) Applicant: Applied Materials, Inc., Santa Clara, CA (US)

(72) Inventor: Tuan Anh Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 287 days.

(21) Appl. No.: 16/651,192

(22) PCT Filed: Sep. 28, 2018

(86) PCT No.: PCT/US2018/053503
§ 371 (c)(1),
(2) Date: Mar. 26, 2020

(87) PCT Pub. No.: WO2019/067948
PCT Pub. Date: Apr. 4, 2019

(65) Prior Publication Data
US 2020/0273677 A1 Aug. 27, 2020

Related U.S. Application Data

(60) Provisional application No. 62/565,900, filed on Sep. 29, 2017.

(51) Int. Cl.
*F16K 3/06* (2006.01)
*F16K 3/02* (2006.01)
(Continued)

(52) U.S. Cl.
CPC ............. *F16K 3/06* (2013.01); *F16K 3/0218* (2013.01); *F16K 31/041* (2013.01); *F16K 51/02* (2013.01);
(Continued)

(58) Field of Classification Search
CPC ........ F16K 3/06; F16K 3/0218; F16K 31/041; F16K 51/02; F16K 37/0041;
(Continued)

(56) References Cited

U.S. PATENT DOCUMENTS 1,286,954 A * 12/1918 Demarest ................ F16K 31/53
251/301
1,438,709 A * 12/1922 Johnson .................. B60R 25/04
251/301
(Continued)

OTHER PUBLICATIONS

International Search Report dated Feb. 1, 2019 for Application No. PCT/US2018/053503.

*Primary Examiner* — John Bastianelli
(74) *Attorney, Agent, or Firm* — Patterson + Sheridan, LLP

(57) ABSTRACT

The present disclosure generally relates to an isolation device for use in processing systems. The isolation device includes a body having a flow aperture formed therethrough. In one embodiment, the isolation device is disposed between a remote plasma source and a process chamber. A closure mechanism is pivotally disposed within the body. The closure mechanism can be actuated to enable or disable fluid communication between the remote plasma source and the process chamber. In one embodiment, the closure mechanism includes a shaft and a seal plate coupled to the shaft. A cross-arm is coupled to the shaft opposite the seal plate. The cross-arm is configured to selectively rotate the shaft and the seal plate of the closure mechanism.

19 Claims, 4 Drawing Sheets

(51) Int. Cl.
  *F16K 31/04* (2006.01)
  *F16K 51/02* (2006.01)
  *H01J 37/32* (2006.01)

(52) U.S. Cl.
  CPC .. *H01J 37/32357* (2013.01); *H01J 37/32623* (2013.01); *H01J 2237/024* (2013.01)

(58) Field of Classification Search
  CPC ........... H01J 37/32357; H01J 37/32623; H01J 2237/024; H01J 37/32; H01J 37/3288
  USPC .......................................... 251/251, 298–303
  See application file for complete search history.

(56) References Cited

U.S. PATENT DOCUMENTS

| | | | | |
|---|---|---|---|---|
| 1,643,300 | A * | 9/1927 | Gold | F16K 39/04 137/625.33 |
| 1,882,600 | A * | 10/1932 | Hollingshead | F16K 27/045 251/366 |
| 3,237,916 | A * | 3/1966 | Bryant | F16K 3/06 251/301 |
| 6,089,537 | A * | 7/2000 | Olmsted | F16K 3/10 251/298 |
| 6,409,149 | B1 * | 6/2002 | Maher, Jr. | F16K 3/06 251/301 |
| 6,932,111 | B2 * | 8/2005 | Ishigaki | F16K 3/06 251/301 |
| 2005/0121088 | A1 | 6/2005 | Dando et al. | |
| 2006/0182534 | A1 * | 8/2006 | Hiroki | H01L 21/67126 414/217 |
| 2010/0132891 | A1 | 6/2010 | Nozawa | |
| 2016/0084400 | A1 | 3/2016 | Sankarakrishnan et al. | |
| 2017/0162366 | A1 | 6/2017 | Yanagisawa | |
| 2017/0200591 | A1 | 7/2017 | Hill et al. | |

* cited by examiner

CLOSURE MECHANISM VACUUM CHAMBER ISOLATION DEVICE AND SUB-SYSTEM

BACKGROUND

Field

Embodiments of the present disclosure generally relate to an isolation device for use in a processing system.

Description of the Related Art

In manufacturing of microelectronic devices such as semiconductor devices, gas sources supply process gases into a process volume of a process chamber. Additionally, in some process chambers or process applications, remote plasma sources are used to provide gas radicals, gas ions, or both to a process chamber in which a process is being carried out on a substrate, or to the process chamber to clean deposits from the interior surfaces thereof. The remote plasma source is generally connected to the process chamber through a port disposed through the body of the process chamber. In order to isolate the remote plasma source from the process chamber, an isolation device, such as a valve, is disposed between the remote plasma source and the process chamber. During operations utilizing the remote plasma source to supply gas radicals, gas ions, or both into the process volume of the process chamber, the isolation device is moved to an open position to allow fluid communication between the process volume of the process chamber and the remote plasma source. After completion of the processing operation, the isolation device is moved to a closed position, thus isolating the remote plasma source from the process volume of the process chamber.

Conventional remote plasma source isolation devices, where a simple valve is utilized in a flowline between the remote plasma source and the port, often suffer from degradation of the sealing mechanism thereof due to exposure of the sealing mechanism to the gas radicals, gas ions, or both from the remote plasma source, or from exposure to the a process chemistry in the process volume of the process chamber. Likewise, some process gases are corrosive or erosive of seal materials, and a traditional valve may need frequent servicing when exposed to these gases. As a result, frequent maintenance is needed to repair or replace the sealing mechanism to maintain functionality. These maintenance operations often involve lengthy outages of the process chamber resulting in reduced utilization of the process chamber.

SUMMARY

In one embodiment of the present disclosure an isolation device is provided. The isolation device includes a body having a flow aperture opening formed therethrough. A closure mechanism is pivotally disposed within the body, The closure mechanism includes a shaft and a seal plate coupled to the shaft. A cross-arm is coupled to the shaft opposite the seal plate and external of the body. The cross-arm is configured to selectively rotate the shaft and the seal plate of the closure mechanism.

In another embodiment of the disclosure an isolation device is provided. The isolation device includes a body with a first flow aperture formed therethrough. A lower plate is coupled to the body and a second flow aperture is formed through the lower plate. A central axis of the first flow aperture is substantially aligned with a central axis of the second flow aperture. A cover plate is coupled to the body. The cover plate includes an opening formed therethrough. The opening is parallel to the first flow aperture and the second flow aperture. A seal plate volume is at least partially defined by the body, the lower plate, and the cover plate. A shaft is disposed through the opening in the cover plate. A seal plate is disposed in the seal plate volume. The shaft is rigidly coupled to a first surface of the seal plate. The seal plate rotates about an axis of the shaft. The seal plate covers the first flow aperture and the second flow aperture when the seal plate is closed.

In yet another embodiment, a system for processing a substrate is provided. The system includes a remote plasma source, a process chamber, and an isolation device disposed between and coupled to the remote plasma source and the process chamber. The isolation device includes a body with a first flow aperture formed therethrough, A lower plate is coupled to the body. A second flow aperture is formed through the lower plate. A central axis of the first flow aperture is substantially aligned with a central axis of the second flow aperture. A cover plate is coupled to the body and an opening is formed through the cover plate. The opening is parallel to the first flow aperture and the second flow aperture. A seal plate volume is at least partially defined by the body, the lower plate, and the cover plate. A shaft is disposed through the opening in the cover plate. A seal plate is disposed in the seal plate volume and has a first surface and a second surface opposite the first surface. The shaft is rigidly coupled to the first surface of the seal plate which is configured to rotate about an axis of the shaft. The seal plate is covers the first flow aperture and the second flow aperture when the seal plate is closed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

DETAILED DESCRIPTION

The embodiments described herein relate to an apparatus for isolating chambers within a processing system from a flow line. Although the description hereof includes a remote plasma chamber, the apparatus is useful for isolating any flow line into, or out of, a substrate process chamber.

Figure 1:
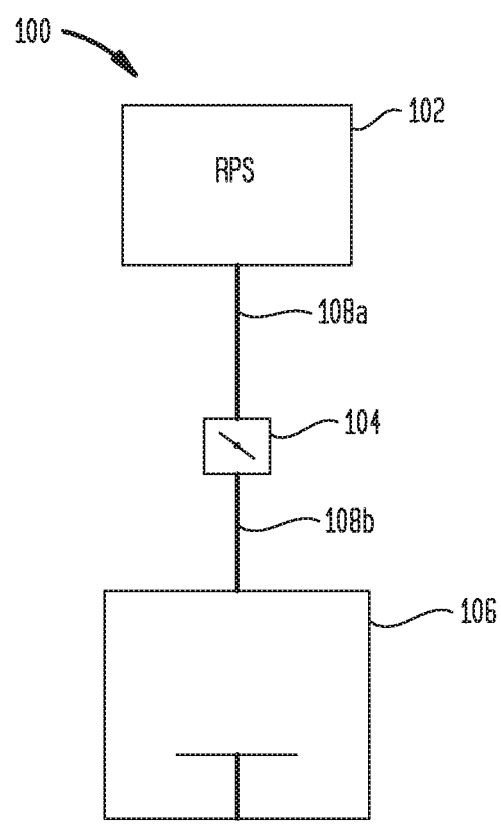
FIG. 1 is a schematic view of a processing apparatus utilizing a remote plasma source.

FIG. 1 is a schematic of an exemplary processing apparatus utilizing a remote plasma source. In FIG. 1, a processing apparatus 100 comprises a remote plasma source 102 coupled to a process chamber 106 by conduits 108a, 108b. An isolation device 104, such as a valve, is disposed between the remote plasma source 102 and the process chamber 106. The isolation device 104 is in fluid communication with the remote plasma source 102 and the process chamber 106 through the conduits 108a, 108b. During processing, passage of fluid, i.e., a gas, through the isolation device 104 may be interrupted to isolate the process chamber 106 from the remote plasma source 102. By opening the isolation device 104 to allow fluid to pass therethrough, gas radicals, gas ions, or both, generated by the remote plasma source 102, can flow from the remote plasma source 102, though the conduits 108a, 108b and the isolation device 104 and into the process chamber 106. The exemplary processing apparatus 100 is disclosed for illustrative purposes only. Other configurations or types of process chambers may be utilized with the embodiments described herein.

Figure 2:
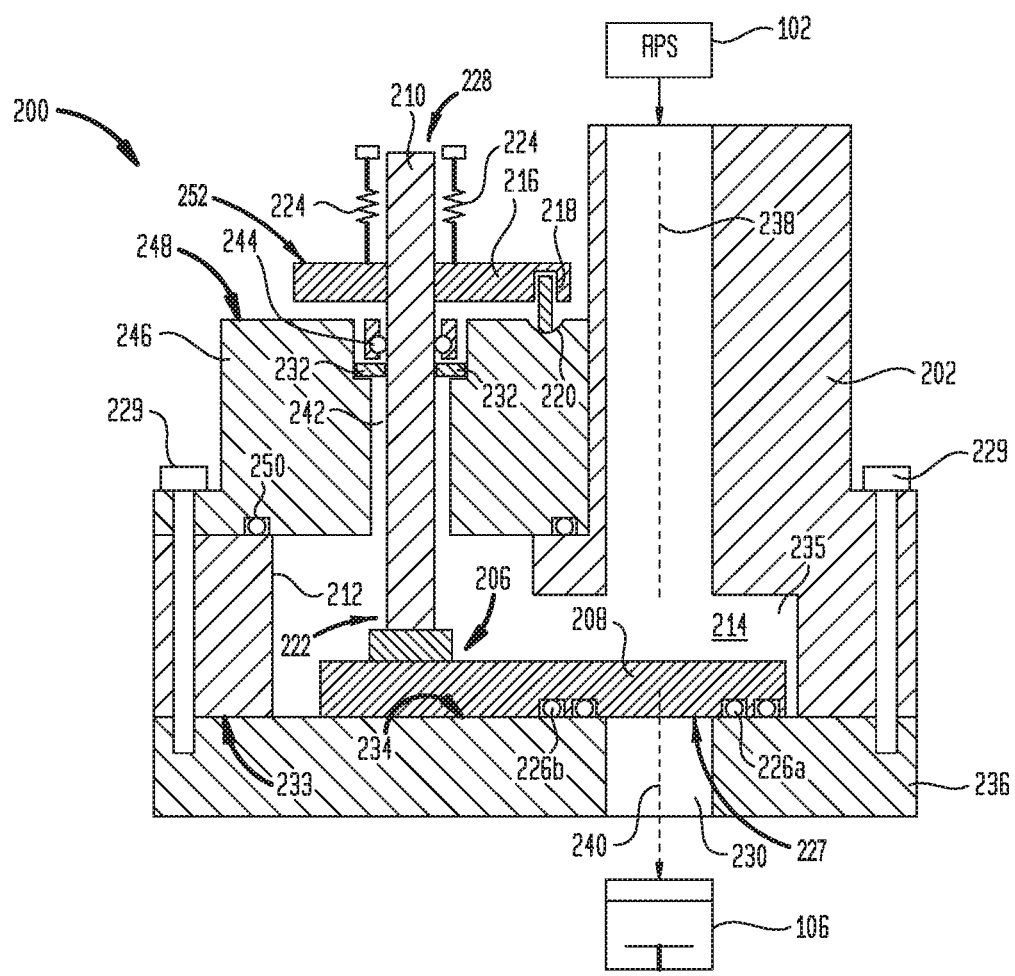
FIG. 2 is a cross-sectional view of an isolation device according to one embodiment.

FIG. 2 is a cross-sectional view of an isolation device 200. The isolation device 200 is disposed between the process chamber 106 and the remote plasma source 102. The isolation device 200 includes a body 202 with a flow aperture 204 formed therethrough. In one embodiment, the body 202 is configured of a metallic material such as aluminum, or alloys thereof. Other suitable materials include materials that are substantially resistant to corrosion, erosion, or reactivity with gases, ions, or radicals passing through the flow aperture 204. In one embodiment, the flow aperture 204 has a circular cross-section. In another embodiment, the flow aperture 204 may have a different cross-section, such as a rectangular cross section. The remote plasma source 102 is in fluid communication with the process volume of the process chamber 106 through the flow aperture 204 and a second flow aperture 230 formed through a lower plate 236. The second flow aperture 230 is aligned with the flow aperture 204. The lower plate 236 covers a side of the body 202 which faces the process chamber 106. The second flow aperture 230 is aligned with a chamber flow opening (not shown) when the body 202 and lower plate 236 are attached to the process chamber 106. A recess 235 is formed in a surface 233 of the body 202 facing the process chamber 106. A seal plate volume 214 is at least partially defined by the recess 235 and the lower plate 236. A centerline 238 of the flow aperture 204 and a centerline 240 of the second flow aperture 230 are parallel and substantially aligned. The flow aperture 204 and the second flow aperture 230 are fluidly connected to the seal plate volume 214. A cover 246 is coupled to the body 202 and partially defines the seal plate volume 214.

A closure mechanism 206 is partially disposed within the body 202. The closure mechanism 206 includes a seal plate 208 coupled to a shaft 210. The seal plate 208 is disposed within the seal plate volume 214. The shaft 210 of closure mechanism 206 extends from the seal plate 208, through an opening 212 formed through the body 202 and through an opening 242 in the cover 246. The shaft terminates external of the body 202. A first end 222 of the shaft 210 is disposed within the body 202 and coupled to the seal plate 208. A second end 228 of the shaft 210 is disposed outwardly of the body 202 and the cover 246, opposite the first end 222. The closure mechanism 206 is fabricated from a metallic material such as aluminum, though other materials resistant to corrosion, erosion, or reactivity with gases, ions, or radicals passing through flow aperture 204 may be used.

The cover 246 is disposed over the opening 212 in the body 202. The opening 212 is sized to allow passage of the seal plate 208 into and out of the seal plate volume 214. The cover 246 is coupled to the body 202 by, for example, threaded fasteners 229, with a seal 250 disposed between the body 202 and the cover 246. The seal 250 (e.g., an O-ring disposed in a groove) prevents leakage of process gases at interface between the body 202 and the cover 246. The cover 246 and the closure mechanism 206 can be removed from the isolation device 202 for maintenance without the body 202 being decoupled from the remote plasma source 102 or the process chamber 106. Accordingly, a time needed for maintenance of the isolation device 200 is greatly reduced which increases utilization of the processing systems coupled thereto. Although the cover 246, as illustrated, is coupled to the body 202 using the threaded fasteners 229, any mechanism capable of coupling the cover 246 to the body 202, such as latches, bonding, or brazing, may be utilized.

A seal 232 and a bearing 244 are disposed in the opening 242 around the shaft 210 to prevent leakage of process gases from the seal plate volume 214 through the opening 242. In certain embodiments, the seal 232 may be an O-ring fabricated from a material selected to reduce deterioration of the seal 232 by reaction with process gases flowing through the isolation device 200. The bearing 244, disposed adjacent the seal 232, enables the shaft 210 to move within the opening 242 and enables the seal plate 208 coupled to the shaft 210 to move within the seal plate volume 214 . In certain embodiments, the bearing 244 comprises one or more ball bearings to facilitate rotational motion and linear motion of the sealing mechanism 206 within the seal plate volume 214.

A cross-arm 216 is coupled to a portion of the shaft 210 extending outwardly of the cover 246. The cross-arm 216 is fixed to the shaft 210 such that rotation of the cross-arm 216 about an axis of the shaft 210 causes rotation of the shaft 210 and causes the seal plate 208 to swing within the seal plate volume 214 about the axis of the shaft 210. A wheel 218 is rotationally coupled to the cross-arm 216 adjacent an end of the cross-arm 216. Recesses 220, 302, 304 (FIG. 3) are formed in an outer surface 248 of the cover 246 and provide detents into which the wheel 218 can seat, Although the recess 220, 302, 304 (FIG. 3) are troughs extending across the upper outer surface 248 of the cover 246, the troughs may be shorter or may be simple hemispherical detents extending inwardly of the outer surface 248, and the wheel 218 may be replaced with a rotating ball (not shown) secured in a short shaft (not shown) extending from the cross-arm 216 toward the cover 246.

The seal plate 208 includes a pair of concentrically aligned seals 226a, 226b disposed in concentric seal ring grooves formed in a surface 227 of the seal plate 208 facing the second flow aperture 230. The seals 226a, 226b are configured to seal against the surface 227 with the seal grooves formed therein and a surface 234 of the lower plate 236 which faces the seal plate volume 214. In one embodiment, the grooves in which the seals 226, 226b are disposed are dovetailed to retain the seals 226a, 226b during the movement of the closure mechanism 206 between the open positon and the closed position.

Figure 3:
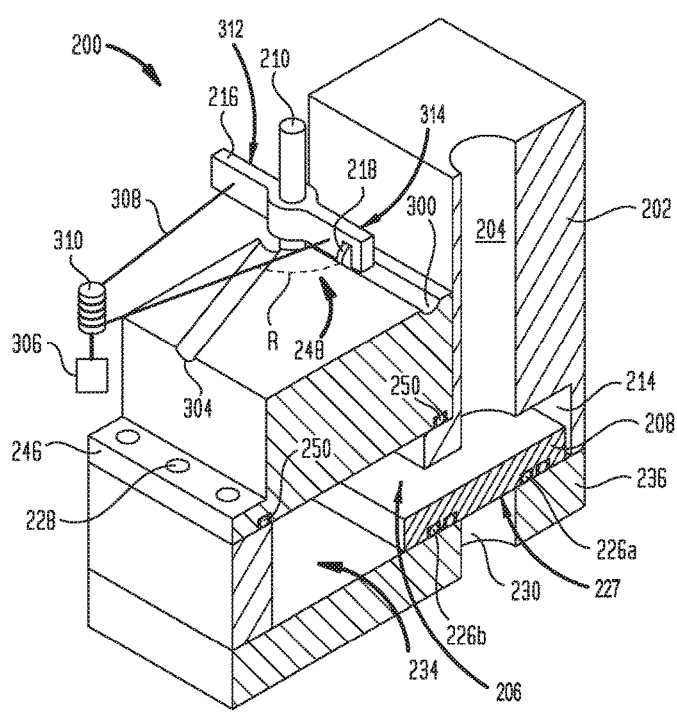
FIG. 3 is an isometric view of an isolation device according to one embodiment.

When the seal plate 208 is in a closed position, as shown in FIG. 3, both seals 226a, 226b surround the second flow aperture 230 and form a seal between the surface 227 of the seal plate 208 and the surface 234 of the lower plate 236 at a location radially outward from the second flow aperture 230. Thus, the seals 226a, 226b each have circumferences larger than that of the second flow aperture 230. Seal 226a encircles the second flow aperture 230 and is referred to as the primary seal. Seal 226b encircles the seal 226a and is referred to the protective seal. Accordingly, seal 226a has a circumference greater than the circumference of the second flow aperture 230, and the seal 226b has a circumference greater than that of both the seal 226a and the second flow aperture 230. In certain embodiments, the seals 226a, 226b are O-rings. The O-rings may comprise a polymer material, a petroleum based material, or a rubber such as nitrile rubber. The material of the O-ring is generally selected in relation to the process gas which will flow through the flow apertures 204, 230 so as to minimize deterioration of the seals 226a, 226b as a result of a reaction with the process gas.

A biasing member 224 is disposed adjacent to the shaft 210 outside of the body 202. The biasing member 224 provides a force to the closure mechanism 206, and thus the seal plate 208, in the direction of the inwardly facing surface 234 of the lower plate 236. The seals 226a, 226b are compressed between the surfaces of the seal grooves and the surface 234 of the seal plate 208 to ensure a hermetic seal between the second flow aperture 230 and the seal plate volume 214. The biasing member 224 is configured to provide a force in a direction such that the seals 226a, 226b contact the surface 234 of the lower plate 236 when the seal plate 208 is positioned over the second flow aperture 230, in a closed position as well as a second position, shown in FIG. 5B, where the seal plate 208 is in an open position.

A cap (not shown), such as a nut, is disposed above the biasing member 224. The cap compresses the biasing member 224 between a lower surface of the cap and an upper surface 252 of the cross-arm 216. The cap enables adjustment (e.g., increase or decrease) of the bias of the biasing member 224 and the resulting force applied to the closure device 206. In certain embodiments, the biasing member 224 is a spring and the cap is a nut coupled the cover 246 by a threaded stud (not shown). The cap remains fixed while the biasing member 224, and the closure mechanism 206 coupled thereto, move rotationally and linearly to maintain the force on the closure mechanism 206. The bias of the spring is adjusted by moving the nut up or down the threaded stud to increase or decrease a distance between the nut and the surface 252 of the cross-arm 216 where the spring is disposed. The force provided by biasing member 224 is configured to withstand an opposing force on the seal plate 208 created by a pressure differential between a pressure in the seal plate volume 214 and a pressure in the second flow aperture 230 when the seal plate 208 is in the closed position.

FIG. 3 is a perspective cutaway view of isolation device 200. The cutaway of the body 202 partially shows the seal plate 208 and the shaft 210. The cross-arm 216 and the wheel 218 coupled thereto are disposed outside of the body 202 and the outer surface 248 of the cover 246. Recesses 302 and 304, like the recess 220 of FIG. 2, are disposed in the outer surface 248 of the cover 246. The biasing member 224 is not shown in FIG. 3 for the sake of clarity of the movement of the closure mechanism 206. An actuator 306 and a linkage 308 are coupled to the cross-arm 216. In the embodiment of FIG. 3, the actuator 306 comprises a motor coupled to a pulley 310. The linkage 308 is a cable coupled to a first portion 312 of the cross-arm 216 on one side of shaft 210. The linkage 308 travels around the pulley 310 by one or more turns, and connects to a second portion 314 of the cross-arm 216 on an opposite side of shaft 210 from the first portion 312.

In one embodiment, the actuator 306 is a stepper motor which applies rotational motion to the pulley 310. The rotational motion includes both clockwise and counterclockwise motion. When the actuator 306 rotates in either direction, the rotational motion generates a torque which is applied to the pulley 310 and the linkage 308 coupled thereto. The torque is translated to the cross-arm 216 by the linkage 308, Thus, the rotational motion of the actuator 306 applies a force to one of the portions 312, 314 of the cross-arm 216. The force applied by actuator 306 to a portion 312, 314 of the cross-arm 216 induces a rotation in the shaft 210 of the closure mechanism 206 about an axis of the shaft 210, Like the actuator 306, the resulting rotation of the shaft 210 can be clockwise or counterclockwise. The rotational motion of the shaft 210 and the cross-arm 216 causes the wheel 218 to traverse an arc R between the recesses 302 and 304 about the axis of the shaft 210. The wheel 218 unseats from either of the recesses 302, 304 as the wheel 218 traverses the arc R. The rotational motion of the shaft 210 and the cross-arm 216 is ceased when the wheel 218 re-seats in either of the recesses 302, 304. The recesses 302, 304 prevent rotation of the closure mechanism 206 without engagement of the actuator 306.

When the actuator 306 is engaged, the interaction of the wheel 218 and a wall of one of the recesses 302, 304 provides a lifting force, caused by the wheel 218 riding upwardly in the recesses 302, 304 to engage against, and roll across, the outer surface 248 of the cover 246. The lifting force provided to the wheel is opposite to the force generated by the biasing member 224 (shown in FIG. 2). The force provided by the biasing member 224 enables the wheel to remain in contact with the outer surface 248 of the cover 246 while the wheel traverses the arc R across the outer surface 248. Therefore, the cross-arm 216 and the shaft 210 are initially raised upward and away from the outer surface 248 by the wheel 218 as the wheel 218 traverses the wall of the recess 302 or 304. The wheel 218 travels along the arc R until reaching the other recess 302 or 304. Upon entering the other recess 302 or 304, the wheel 218 is seated into the recess 302 or 304 by the downward bias of the biasing member 224 (shown in FIG. 2). Thus, as the wheel 218 traverses the wall of the recess 302 or 304, the cross-arm 216 and the shaft 210 move toward the lower plate 236. Once the wheel is seated in the recess 302 or 304, the actuator 306 stops rotating. In certain embodiments, a control system (not shown) comprising sensors and a controller coupled to the isolation device 200 selectively engages the actuator 306 to automatically position the isolation device 200 to be open or closed.

The shaft 210 is fixed to both the cross-arm 216 and the seal plate 208. Therefore, movement of the seal plate 208 is substantially identical to the movement of the cross-arm 216. When the actuator 306 is engaged to rotate in one direction or the other, the seal plate 208 and the seals 226a, 226b disposed therein lift away from the surface 234 of the lower plate 236, rotate in a direction similar to that of the shaft 210, and lower toward the surface 234 in a similar manner as the cross-arm 216 lifts away from the outer surface 248 of the cover 246, rotates in a direction similar to that of the shaft, and lowers toward the outer surface 248. The seal plate 208, including the seals 226a, 226b disposed therein, rotates about the axis of the shaft 210. Additionally, the motion of the wheel 218 causes the seal plate 208 and seals 226a, 226b to lift away from the surface 234 of the lower plate 236 which creates a small gap between the surface 234 of the lower plate 236 and the seals 226a, 226b and the seal plate 208. The gap provides a clearance for the seal plate 208 and the seals 226a, 226b to rotate with shaft 210 without contacting the surface 234 of the lower plate 236. Contact between the seals 226a, 226b and an adjoining surface (other than the seal groove surfaces) during movement of the seals 226a, 226b can damage the seals 226a, 226b. The rotational movement of the shaft 210 and swinging of the seal plate 208 through an arc enables the isolation device 200 to be selectively positioned in an open position and a closed position without the surface 227 of the seal plate 208 rubbing the surface 234 of the lower plate 236. Detailed descriptions of the open position and closed position are provided with reference to FIGS. 5A and 5B.

The actuator 306 and linkage 308 are not limited to a pulley-cable combination. In certain embodiments, the linkage 308 can be a second arm that is coupled between the actuator 306 and the cross-arm 216, to push and pull one end of the cross-arm 216 and thereby rotate the shaft 210. In further embodiments, the actuator 306 may be a linear actuator that couples directly to the cross-arm 216. In still further embodiments, an actuator 306 may be coupled directly to the shaft 210. Any means of providing a rotational motion to the closure mechanism 206 may be utilized.

Figure 4:
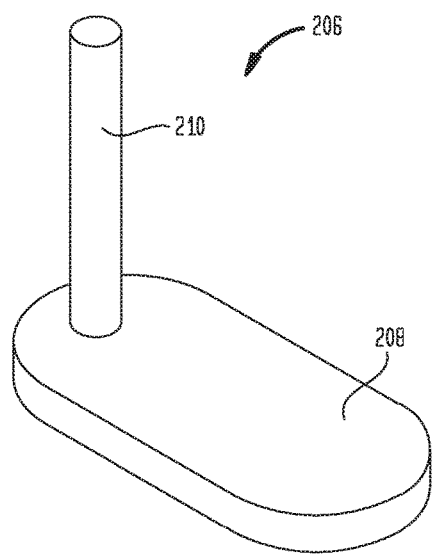
FIG. 4 is an isometric view of an exemplary closure mechanism according to one embodiment.

FIG. 4 is a perspective view of an exemplary closure mechanism 206. The closure mechanism 206 comprises the shaft 210 coupled to the seal plate 208. In this embodiment, the shaft 210 is coupled to the seal plate 208 near an end of the seal plate 208. It is contemplated that the shaft 210 may couple to the seal plate 208 at different locations, so long as the recess 235 in the body (illustrated in FIG. 1) is sufficiently sized to enable the seal plate 208 to rotate in the seal plate volume 214 without coming into contact with the side walls of the seal plate volume 214. For example, the shaft 210 may be coupled to the seal plate 208 near a center of the seal plate 208. The closure mechanism 206 of FIG. 4 is shown in a simplified geometry for brevity. It is understood that the shape of closure mechanism 206, particularly the seal plate 208, may be different. For example, the seal plate 208 may be configured with a taper from an upper surface to lower surface in order to minimize the size of isolation device 200. Further, the seal plate 208 may be a rectangular box, a cylinder, or the like.

Figure 5A:
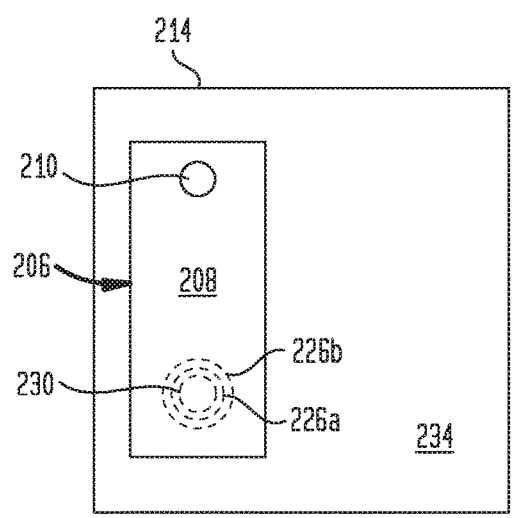
FIG. 5A is a schematic plan view of a valve in a closed position according to one embodiment.
Figure 5B:
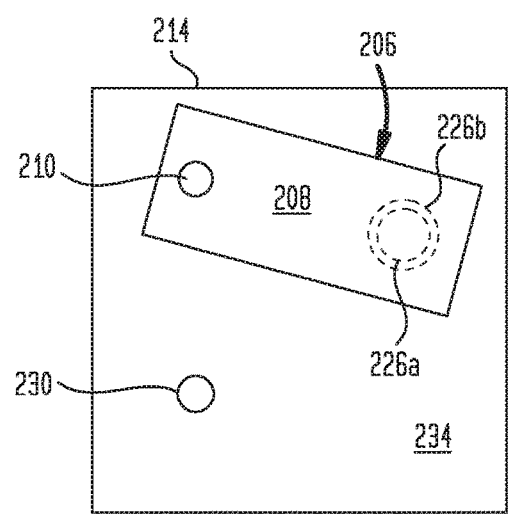
FIG. 5B is a schematic plan view of a valve in an open position according to one embodiment, To facilitate understanding, identical reference numerals have been used, where possible, to designate identical elements that are common to the figures. It is contemplated that elements and features of one embodiment may be beneficially incorporated in other embodiments without further recitation.

FIG. 5A and FIG. 5B are top down plan views of a portion of the isolation device 200. A boundary is shown surrounding the closure mechanism 206 and at least partially defining the seal plate volume 214. The seal plate 208, depicted as a rectangle, is coupled to, and rotates about, the shaft 210. Seals 226a, 226b, indicated as dash-dash lines, are disposed in grooves (not shown) in the seal plate 208 opposite the shaft 210. The second flow aperture 230 formed through the lower plate 236 (as illustrated in FIG. 2) is within the boundary of the seal plate volume 214.

In FIG. 5A, the seal plate 208 covers the second flow aperture 230. The seals 226a, 226b, indicated by dashed lines, encircle the second flow aperture 230, also indicated by a dashed line, and contact the surface 234 of the lower plate 236 at locations radially outward of and surrounding the second flow aperture 230. In this position, referred to as the closed position, the seals 226a, 226b form a hermetic seal around the second flow aperture 230 and seal the second flow aperture 230 from the seal plate volume 214 and the flow aperture 204 (illustrated in FIG. 2). Thus, seal plate 208 and the seals 226a, 226b prevent flow of process gas, such as the output of the remote plasma source 102 illustrated in FIG. 1, to the process volume of the process chamber 106. Conversely, the seal created by the seals 226a, 226b in the closed position isolates the remote plasma source 102 from the process volume of the process chamber 106.

In FIG. 5B, the seal plate 208 does not cover the second flow aperture 230. This is referred to as the open position. The seal plate 208 is lifted from the surface 234 and rotated away from the second flow aperture 230. Once the seal plate 208 is rotated away from the second flow aperture 230, the seal plate 208 is lowered toward the surface 234. Moving the seal plate 208 away from the second flow aperture 230 enables fluid communication between the second flow aperture 230, the seal plate volume 214, and the flow aperture 204 (illustrated in FIG. 2). In the open position, the seals 226a, 226b contact a different portion of the surface 234 than when the seal plate is in the closed position. That is, in the open position, the seals 226a, 226b do not surround the second flow aperture 230.

In both the open and closed positions, the seal 226b at least partially forms a sealed annular volume around seal 226a. That is, the annular volume is formed between the seal 226a and the seal 226b. The annular volume prevents exposure of the seal 226a to gas radicals, gas ions, or both generated by the remote plasma source 102 when the closure mechanism is in the open position. The seal 226b increases a maintenance interval for repair or replacement of the primary seal 226a by minimizing deterioration of the primary seal 226a due to exposure to the output of the remote plasma source 102. In certain embodiments, a small gap, such as between about 10 mils and about 20 mils, is maintained between the seal plate 208 and the surface 234 of the lower plate 236 to prevent generation of contaminant particles caused by contact between the seal plate 208 and the surface 234.

The isolation device 200 is positioned to be in the open position as illustrated in FIG. 5B or closed position as illustrated in FIG. 5A to selectively enable flow of gas radicals, gas ions, or both from the remote plasma source 102 through the isolation device 200. The embodiments described herein advantageously increase the maintenance interval of the seals of the isolation device 200, thereby increasing the maintenance interval of the isolation device 200. The embodiments herein further reduce the necessary maintenance of an isolation device for use in processing systems by simplifying the design of the isolation device and minimizing the number of components needed to form the isolation device. Accordingly, the embodiments herein increase the production utilization of the process chambers coupled the isolation device described herein. It is understood that the embodiments described herein are not limited to the exemplary process system. Any system in which a volume is to be isolated from another volume may benefit from the embodiments described herein.

While the foregoing is directed to embodiments of the present disclosure, other and further embodiments of the disclosure may be devised without departing from the basic scope thereof, and the scope thereof is determined by the claims that follow.

What is claimed is:
1. An isolation device, comprising:
a body having a flow aperture formed therethrough;
a cover plate coupled to the body, the cover plate having an opening therethrough and a recess in a surface thereof;

a closure mechanism pivotally disposed within the body, the closure mechanism comprising:
a shaft disposed through the opening of the cover plate; and
a seal plate coupled to the shaft;
a cross-arm coupled to the shaft opposite the seal plate and external of the body, the cross-arm configured to selectively rotate the shaft and the seal plate of the closure mechanism; and
a wheel rotationally coupled to the cross-arm, the wheel disposed in the recess when the seal plate is closed.

2. The isolation device of claim 1, wherein the body and the closure mechanism comprise a metallic material.

3. The isolation device of claim 2, wherein the metallic material comprises aluminum.

4. The isolation device of claim 1, further comprising:
a biasing member coupled to the cross-arm and configured to provide a force to the cross-arm in a direction along the shaft and toward the seal plate.

5. The isolation device of claim 1, further comprising a biasing member coupled to the cross-arm.

6. The isolation device of claim 1, further comprising a first seal and a second seal surrounding the first seal, the first seal and the second seal disposed in the seal plate of the closure mechanism.

7. The isolation device of claim 6, wherein the first seal and the second seal surround the flow aperture when the closure mechanism is positioned to form a seal around the flow aperture.

8. An isolation device, comprising:
a body having a first flow aperture formed therethrough;
a lower plate coupled to the body;
a second flow aperture formed through the lower plate, a central axis of the first flow aperture substantially aligned with a central axis of the second flow aperture;
a cover plate coupled to the body, the cover plate having an opening formed through the cover plate and a recess in surface of the cover plate, the opening parallel to the first flow aperture and the second flow aperture;
a seal plate volume at least partially defined by the body, the lower plate, and the cover plate;
a shaft disposed through the opening in the cover plate;
a seal plate disposed in the seal plate volume and coupled to the shaft, the seal plate having a first surface and a second surface opposite the first surface, the shaft rigidly coupled to the first surface of the seal plate, the seal plate configured to rotate about an axis of the shaft, the seal plate covering the first flow aperture and the second flow aperture when the seal plate is closed;
a cross-arm coupled to the shaft opposite the seal plate; and
a wheel rotationally coupled to the cross-arm, the wheel disposed in the recess when the seal plate is closed.

9. The isolation device of claim 8, further comprising:
one or more seal grooves formed in the second surface of the seal plate; and
one or more seals disposed in the one or more seal grooves.

10. The isolation device of claim 9, wherein the one or more seals surround the second flow aperture when the seal plate covers the second flow aperture.

11. The isolation device of claim 9, wherein the one or more seal grooves and the one or more seals surround the second flow aperture when the seal plate is closed.

12. The isolation device of claim 9, wherein the wheel unseats from the recess and traverses an arc about the axis of the shaft on the cover plate.

13. The isolation device of claim 8, further comprising:
an actuator coupled to the shaft.

14. A system for processing a substrate, comprising:
a remote plasma source;
a process chamber; and
an isolation device disposed between and coupled to the remote plasma source and the process chamber, the isolation device comprising:
a body having a first flow aperture formed therethrough;
a lower plate coupled to the body;
a second flow aperture formed through the lower plate, a central axis of the first flow aperture substantially aligned with a central axis of the second flow aperture;
a cover plate coupled to the body, the cover plate having an opening formed through the cover plate and a recess in surface of the cover plate, the opening parallel to the first flow aperture and the second flow aperture;
a seal plate volume at least partially defined by the body, the lower plate, and the cover plate;
a shaft disposed through the opening in the cover plate;
a seal plate disposed in the seal plate volume and coupled to the shaft, the seal plate having a first surface and a second surface opposite the first surface, the shaft rigidly coupled to the first surface of the seal plate, the seal plate configured to rotate about an axis of the shaft, the seal plate covering the first flow aperture and the second flow aperture when the seal plate is closed;
a cross-arm coupled to the shaft opposite the seal plate; and
a wheel rotationally coupled to the cross-arm, the wheel disposed in the recess when the seal plate is closed.

15. The system of claim 14, further comprising:
one or more seal grooves formed in the second surface of the seal plate; and
one or more seals disposed in the one or more seal grooves.

16. The system of claim 15, wherein the one or more seals surround the second flow aperture when the seal plate covers the second flow aperture.

17. The system of claim 15, wherein the one or more seal grooves and the one or more seals surround the second flow aperture when the seal plate is closed.

18. The system of claim 15, further comprising:
a recess formed in a surface of the cover plate;
a cross-arm coupled to the shaft opposite the seal plate; and
a wheel rotationally coupled to the cross-arm and disposed in the recess, the wheel disposed in the recess when the seal plate is closed,
wherein the wheel unseats from the recess and traverses an arc about the axis of the shaft on the cover plate.

19. The system of claim 14, further comprising:
an actuator coupled to the shaft.

* * * * *